(12) United States Patent
Koh et al.

(10) Patent No.: US 8,405,810 B2
(45) Date of Patent: Mar. 26, 2013

(54) LIQUID CRYSTAL DISPLAY AND FABRICATING METHOD THEREOF

(75) Inventors: Youngju Koh, Paju-si (KR); Mungi Park, Ansan-si (KR)

(73) Assignee: LG Display Co., Ltd., Seoul (KR)

(*) Notice: Subject to any disclaimer, the term of this patent is extended or adjusted under 35 U.S.C. 154(b) by 475 days.

(21) Appl. No.: 12/654,608

(22) Filed: Dec. 24, 2009

(65) Prior Publication Data

US 2011/0019144 A1    Jan. 27, 2011

(30) Foreign Application Priority Data

Jul. 23, 2009  (KR) .................. 10-2009-0067442

(51) Int. Cl.
*G02F 1/134363* (2006.01)
(52) U.S. Cl. ........................................ 349/141
(58) Field of Classification Search .................. None
See application file for complete search history.

(56) References Cited

U.S. PATENT DOCUMENTS

| | | | |
|---|---|---|---|
| 6,266,117 B1 | 7/2001 | Yanagawa et al. | |
| 2003/0063241 A1* | 4/2003 | Matsumoto et al. | 349/110 |
| 2004/0027524 A1 | 2/2004 | Shiota et al. | |
| 2004/0263757 A1* | 12/2004 | Kwon | 349/149 |
| 2006/0077324 A1* | 4/2006 | Ahn | 349/114 |
| 2007/0153198 A1* | 7/2007 | Cho et al. | 349/141 |
| 2008/0122767 A1* | 5/2008 | Lim et al. | 345/87 |

* cited by examiner

*Primary Examiner* — Thanh-Nhan P Nguyen
(74) *Attorney, Agent, or Firm* — McKenna Long & Aldridge, LLP

(57) ABSTRACT

A liquid crystal display (LCD) includes: a gate line formed as a first conductive pattern; a common line formed as the first conductive pattern; a data line insulatedly crossing the gate line and the common line, and formed as a second conductive pattern; a thin film transistor (TFT) formed at a crossing of the gate line and the data line; a common electrode formed as a third conductive pattern, and connected with the common line; and a pixel electrode connected with the TFT and formed as the third conductive pattern to form a horizontal field together with the common electrode, wherein the third conductive pattern is formed as a dual-layer comprising a metal film and a low reflection film formed on the metal film.

8 Claims, 9 Drawing Sheets

Before being hazed

After being hazed

LIQUID CRYSTAL DISPLAY AND FABRICATING METHOD THEREOF

This nonprofessional application claims priority under 35 U.S.C. §119(a) based upon patent application Ser. No. 10-2009-0067442 filed in Republic of Korea on Jul. 23, 2009 the entire contents of which are hereby incorporated by reference for all purposes as if fully set forth herein.

BACKGROUND OF THE INVENTION

1. Field of the Invention

This document relates to a liquid crystal display and, more particularly, to a liquid crystal display and its fabrication method capable of increasing a contrast ratio while reducing a scattered reflection from a surface.

2. Discussion of the Related Art

A liquid crystal display (LCD) displays images by adjusting light transmittance of liquid crystal by using fields. The LCD is divided into a vertical field application type LCD and a horizontal field application type LCD according to the direction of fields that drive liquid crystal.

The vertical field application type LCD drives liquid crystal in a twisted nematic (TN) mode by vertical fields formed between pixel electrodes and common electrodes disposed in a facing manner on upper and lower substrates. The vertical field application type LCD is advantageous in that it has a high aperture ratio but disadvantageous in that its viewing angle is narrow.

The horizontal field application type LCD drives liquid crystal in an in-plane switching (IPS) mode by horizontal fields formed between pixel electrodes and common electrodes disposed to be parallel on a lower substrate. The horizontal field application type LCD has an advantage that its viewing angle is relatively very large.

The horizontal field application type LCD includes a thin film transistor (TFT) array substrate (i.e., lower plate) and a color filter array substrate (upper plate) attached in a facing manner, spacers uniformly maintaining a cell gap between the two substrates, and liquid crystal filled in the cell gap.

The TFT array substrate includes a plurality of signal wirings and TFTs for forming horizontal fields by the pixel, and an alignment film coated thereon to align liquid crystal. The color filter array substrate includes color filters for color implementation, black matrixes for preventing light leakage, and an alignment film coated thereon to align liquid crystal. Liquid crystal varies light transmittance by the horizontal field formed between the pixel electrodes and common electrodes.

In the LCD, generally, the pixel electrodes and the common electrodes are formed as a single transparent conductive film or a single metal film.

When the pixel electrodes and common electrodes are formed as a single metal layer, respectively, metal with high reflexibility has strong qualities of reflecting external light made incident to a display surface. The reflected external light causes constructive interference or destructive interference with light made incident from a backlight of the LCD, which then passes through a polarizer, causing a spot with a diffraction pattern generated on a display image of the portion where external light has been reflected.

If the pixel electrodes and the common electrodes are formed as a transparent conductive film to reduce reflexibility, although the reflexibility is lowered, quality of black luminance is degraded due to an increase in transmissivity, resulting in degradation of a contrast ratio.

SUMMARY OF THE INVENTION

An aspect of this document is to provide a liquid crystal display (LCD) and its fabrication method capable of reducing reflexibility on a surface of an electrode with respect to external light and increasing a contrast ratio of a display image.

In an aspect, a liquid crystal display (LCD) includes: a gate line formed as a first conductive pattern; a common line separated from the gate line and formed as the first conductive pattern; a data line insulatedly crossing the gate line and the common line to define a pixel area, and formed as a second conductive pattern; a thin film transistor (TFT) formed at a crossing of the gate line and the data line; a common electrode formed as a third conductive pattern at the pixel area, and connected with the common line; and a pixel electrode connected with the TFT and formed as the third conductive pattern to form a horizontal field together with the common electrode in the pixel area, wherein the third conductive pattern is formed as a dual-layer comprising a metal film and a low reflection film formed on the metal film.

The low reflection film may contain a nitride material or an oxide material.

The low reflection film may comprise at least one of CuNx, MoTiNx, ITO, IZO, TO, and CrOx.

The low reflection film may have a thickness of 30 Å to 1000 Å.

The LCD may further include: a gate pad comprising a gate pad lower electrode connected with the gate line and a gate pad upper electrode being in contact with the gate pad lower electrode via a contact hole; a data pad comprising a data pad lower electrode connected with the data line and a data pad upper electrode being in contact with the data pad lower electrode via a contact hole; and a common pad comprising a common pad lower electrode connected with the common line and a common pad upper electrode being in contact with the common pad lower electrode via a contact hole, wherein the gate pad upper electrode, the data pad upper electrode, and the common pad upper electrode are formed as the third conductive pattern.

In another aspect, a liquid crystal display (LCD) includes: a gate line formed as a first conductive pattern; a common line separated from the gate line and formed as the first conductive pattern; a data line insulatedly crossing the gate line to define a pixel area, and formed as a second conductive pattern; a thin film transistor (TFT) formed at a crossing of the gate line and the data line; a common electrode connected with the common line and formed as a third conductive pattern; and a pixel electrode connected with the TFT and formed as the third conductive pattern to form a field together with the common electrode at the pixel area, wherein the third conductive pattern is formed as a transparent conductive film having an embossed surface through haze processing.

The transparent conductive film may comprise indium tin oxide (ITO) or indium zinc oxide (IZO).

The pixel electrode may form a horizontal field or a vertical field together with the common electrode.

In still another aspect, a method for fabricating a liquid crystal display (LCD) includes: forming a gate line with a first conductive pattern, a gate electrode of a thin film transistor (TFT) connected with the gate line, and a common line separated from the gate line on a substrate; coating a gate insulating layer on the entire surface of the resultant substrate and forming a semiconductor pattern at a certain region on the gate insulating layer; forming a data line with a second conductive pattern on the semiconductor pattern such that it crosses the gate line and the common line to define a pixel area, a source electrode of the TFT connected with the data line, and a drain electrode of the TFT facing the source electrode; coating a passivation film on the entire surface of the resultant substrate, and patterning the passivation film and the gate insulating layer to expose a portion of the common line and a portion of the drain electrode; forming a common electrode as a third conductive pattern connected with the exposed common line; and forming a pixel electrode as the third conductive pattern connected with the exposed drain electrode to form a horizontal field at the pixel area, the pixel electrode facing the common electrode, wherein the third conductive pattern is formed as a dual-layer comprising a metal film and a low reflection film formed on the metal film.

In yet another aspect, a method for fabricating a liquid crystal display (LCD) includes: forming a gate line as a first conductive pattern, a gate electrode of a thin film transistor (TFT) connected with the gate line, and a common line separated from the gate line on a substrate; coating a gate insulating layer on the entire surface of the resultant substrate and forming a semiconductor pattern at a certain region on the gate insulating layer; forming a data line with a second conductive pattern on the semiconductor pattern such that it crosses the gate line to define a pixel area, a source electrode of the TFT connected with the data line, and a drain electrode of the TFT facing the source electrode; coating a passivation film on the entire surface of the resultant substrate, and patterning the passivation film and the gate insulating layer to expose a portion of the common line and a portion of the drain electrode; forming a common electrode as a third conductive pattern connected with the exposed common line; and forming a pixel electrode as the third conductive pattern connected with the exposed drain electrode to form a horizontal field at the pixel area, the pixel electrode facing the common electrode, wherein the third conductive pattern is formed as a transparent conductive film having an embossed surface through haze processing.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Hereinafter, exemplary embodiments of the present invention will now be described with reference to FIGS. 1 to 9. In the following exemplary embodiments, an in-plane switching (IPS) mode thin film transistor (TFT) array substrate fabricated through a four-masking process and its fabrication method will be described, but the technical idea of the present invention is not meant to be limited to the number of masks and a field mode scheme for driving liquid crystal.

<First Embodiment>

A first exemplary embodiment of the present invention will now be described with reference to FIGS. 1 to 5b. In the first exemplary embodiment, pixel part and pad part electrodes are formed as a dual-layer including a metal film and a low reflection film formed on the metal film.

Figure 1:
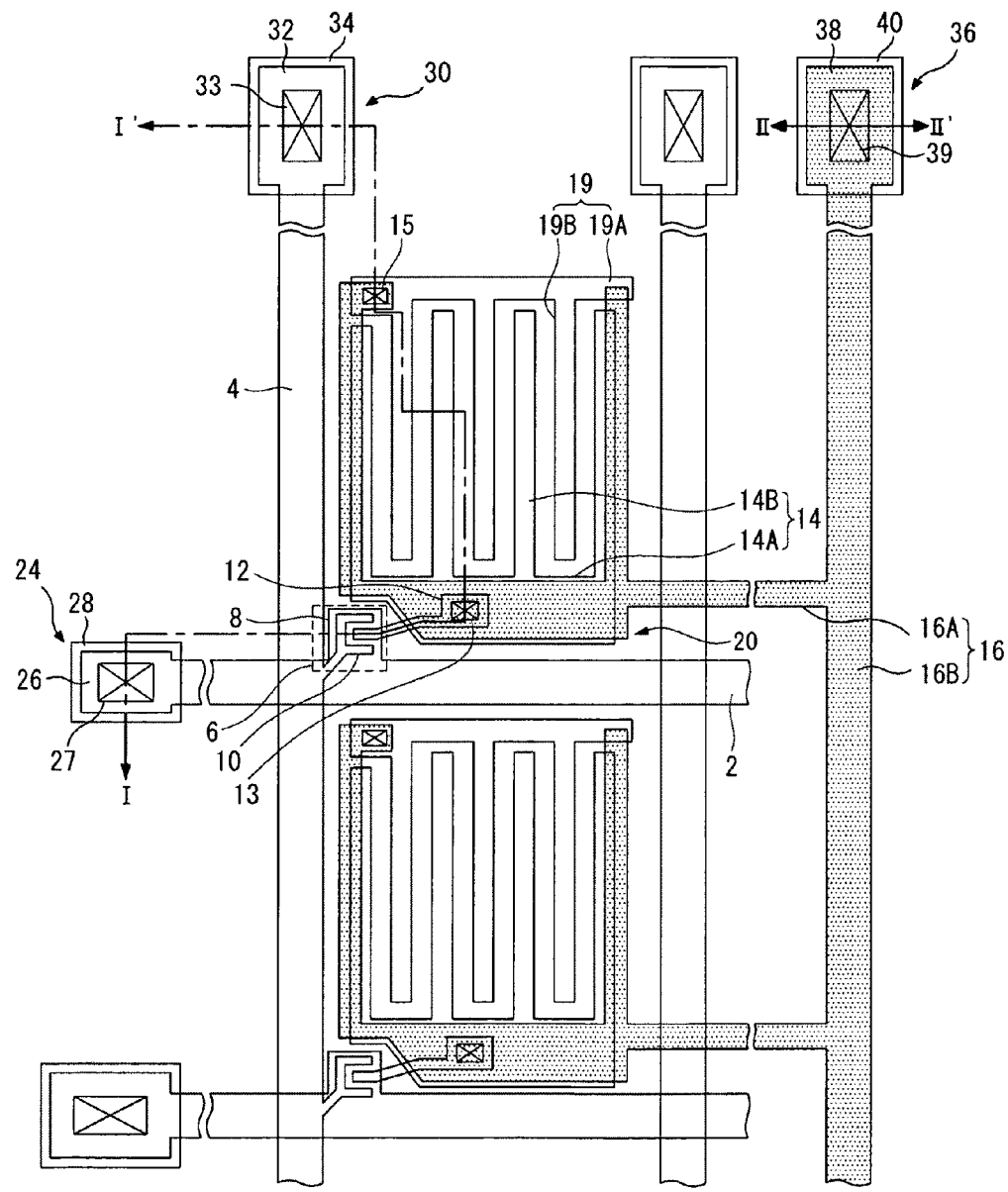
FIG. 1 is a plan view of a thin film transistor (TFT) array substrate according to a first exemplary embodiment of the present invention.
Figure 2:
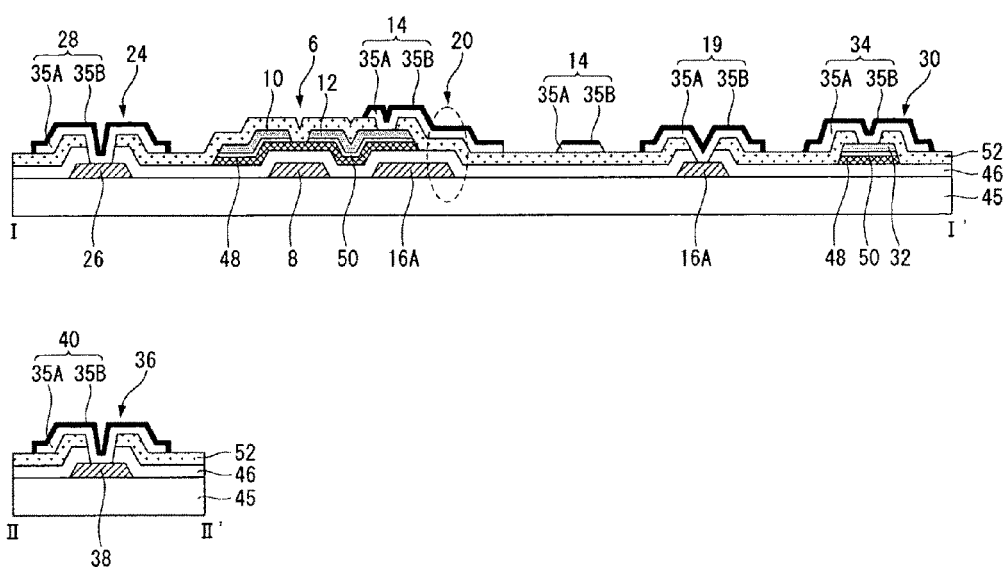
FIG. 2 is a sectional view of the TFT array substrate taken along lines I-I' and of FIG. 1.

FIG. 1 is a plan view of a thin film transistor (TFT) array substrate according to a first exemplary embodiment of the present invention, and FIG. 2 is a sectional view of the TFT array substrate taken along lines I-I' and II-II' of FIG. 1.

The TFT array substrate illustrated in FIGS. 1 and 2 includes a gate line 2 and a data line 4 formed to cross with a gate insulating layer 46 interposed therebetween on a lower substrate 45, a TFT 6 formed at each crossing, a pixel electrode 14 and a common electrode 19 formed to form a horizontal field at a pixel area provided with the crossing structure, and a common line 16 connected with the common electrode 19. Further, the TFT array substrate includes a storage capacitor 20 formed at an overlap portion of the common line 16 and the pixel electrode 14, a gate pad 24 connected with the gate line 2, a data pad 33 connected with the data line 4, and a common pad 36 connected with the common line 16.

The gate line 2 supplying a gate signal and the data line 4 supplying a data signal are formed with a crossing structure with the gate insulating layer interposed therebetween, defining the pixel area. Here, the gate line 2 is formed as a first conductive pattern (i.e., gate metal pattern), and the data line 4 is formed as a second conductive pattern (i.e., source/drain metal patterns).

The common line 16 and the common electrode 19 supply a reference voltage for driving liquid crystal. The common line 16 includes an internal common line 16A formed to partially overlap with the pixel electrode 14 at a display area and an external common line 16B commonly connecting internal common lines 16A at a non-display area. The common line 16 is formed as a first conductive pattern.

The common electrode 19 includes a horizontal part 19A formed to be parallel to the gate line 2 and connected with the internal common line 16A via a second contact hole 15 penetrating through the gate insulating layer 46 and a passivation film 52, and a finger part 19B extending from the horizontal part 19A to the pixel area. The common electrode 19 is formed as a third conductive pattern of a dual-layer including a metal film 35A and a low reflection film 35B.

The TFT 6 is switched in response to a gate signal of the gate line 2 to charge a pixel signal of the data line 4 to the pixel electrode 14. To this end, the TFT includes a gate electrode 8 connected with the gate line 2, a source electrode 10 connected with the data line 4, and a drain electrode 12 connected with the pixel electrode. Further, the TFT 6 includes an active layer 48 overlapping with the gate electrode 88 and the internal common line 16A with the gate insulating layer 46 interposed therebetween and forming a channel between the source electrode 10 and the drain electrode 12, and an ohmic-contact layer 50 formed on the active layer 48, excluding the channel, for an ohmic-contact with the source electrode 10 and the drain electrode 12. The active layer 48 and the ohmic-contact layer 50 are formed to overlap with the data line 4 formed as the second conductive pattern and the data pad lower electrode 32 together with the source electrode 10 and the drain electrode 12.

The pixel electrode 14, facing the common electrode 19 at the pixel area, forms a horizontal field. The pixel electrode 14 is connected with the drain electrode 12 of the TFT 6 via a first contact hole 13 penetrating through the passivation film 52 and formed at the pixel area. In particular, the pixel electrode 14 includes a horizontal part 14A connected with the drain electrode 12 and formed to be parallel to an adjacent gate line 2, and a finger part 14B, which has a finger shape, extending from the horizontal part 14A to the pixel area and formed to be parallel to the finger part of the common electrode 19. The pixel electrode 14 is formed as a third conductive pattern formed as a dual-layer including the metal film 35A and the low reflection film 35B.

The horizontal part 14A and the outermost finger part 14B of the pixel electrode 14 overlap partially with the internal common line 16A with the gate insulating layer 46 and the passivation film 52 interposed therebetween, forming a storage capacitor 20. The storage capacitor 20 stably maintains a pixel signal of a current which has been charged in the pixel electrode 14 until when a pixel signal of a next frame is charged.

The gate line 2 is connected with a gate driver (not shown) via the gate pad 24. The gate pad 24 includes a gate pad lower electrode 26 extending from the gate line 2 and a gate pad upper electrode 28 connected with the gate pad lower electrode 26 via a third contact hole 27 penetrating through the gate insulating layer 46 and the passivation film 52. The gate pad lower electrode 26 is formed as the first conductive pattern, and the gate pad upper electrode 28 is formed as the third conductive pattern of a dual-layer including the metal film 35A and the low-resistance film 35B.

The data line 4 is connected with a data driver (not shown) via a data pad 30. The data pad includes a data pad lower electrode 32 extending from the data line 4 and a data pad upper electrode 34 connected with the data pad lower electrode 32 via a fourth contact hole 33 penetrating through the passivation film 52. The data pad lower electrode 32 is formed as the second conductive pattern, and the data pad upper electrode 34 is formed as the third conductive pattern of a dual-layer including the metal film 35A and the low reflection film 35B.

The common line 16 is connected with an external reference voltage source (not shown) via the common pad 36. The common pad 36 includes a common pad lower electrode 38 extending from the eternal common line 16B and a common pad upper electrode 40 connected with the common pad lower electrode 38 via a fifth contact hole 39 penetrating through the gate insulating layer 46 and the passivation film 52. The common pad lower electrode 38 is formed as the first conductive pattern, and the common pad upper electrode 40 is formed as the third conductive pattern of a dual-layer including the metal film 35A and the low reflection 35B.

The third conductive pattern including the pixel electrode 14, the common electrode 19, the gate pad upper electrode 28, the data pad upper electrode 34, and the common pad upper electrode 40 includes the metal film 35A. Thus, according to the exemplary embodiment of the present invention, an increase in the transmissivity can be restrained, and thus, a contrast ratio of an image can be enhanced, compared with the case where the third conductive pattern is formed only as a single transparent conductive film. In this case, if the third conductive pattern is formed only as a single metal film, the metal film having a high reflexibility would scattered-reflect external light to degrade a display quality, so in the exemplary embodiment of the present invention, the low reflection film 35B is additionally formed on the metal film 35A. The low reflection film 35B contains a nitride material or an oxide material to reduce a surface reflexibility with respect to external light.

A method of fabricating the TFT array substrate with such a configuration will now be described through four masking processes.

Figure 3A:
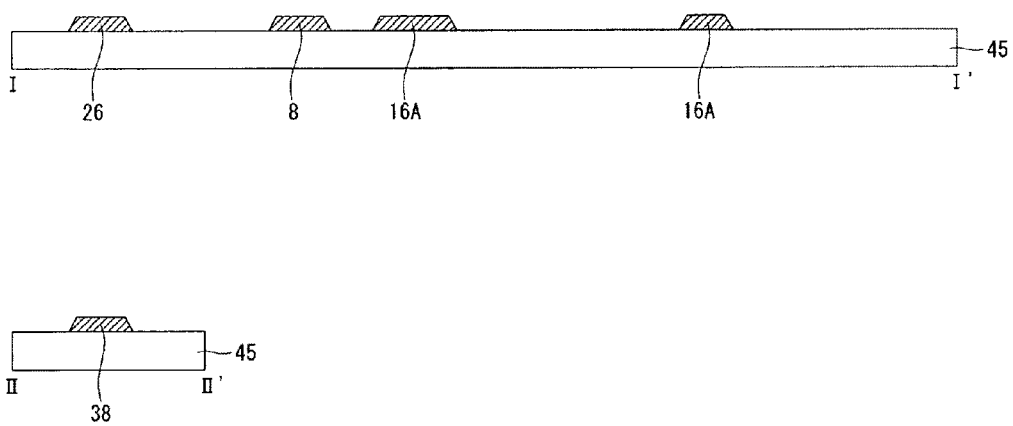
FIGS. 3a to 3d are sequential sectional views showing a method of fabricating a TFT array substrate.

With reference to FIG. 3a, a first conductive pattern group, including the gate line 2, the gate electrode 8, the gate pad lower electrode 26, the common line 16, and the common pad lower electrode 38, is formed on the lower substrate 45 through a first masking process.

In detail, a first conductive material is formed on the lower substrate 45 through a deposition method such as sputtering. Next, the first conductive material is patterned through a photolithography process and an etching process using a first mask to form the gate line 2, the gate electrode 8, the gate pad lower electrode 26, the common line 16, and the common pad lower electrode 38. Here, as the first conductive material, Cr, MoW, MoTi, Cr/Al, Cu, Al(Nd), Mo/Al, Mo/Al(Nd), Cr/Al (Nd), and the like, may be used.

Figure 3B:
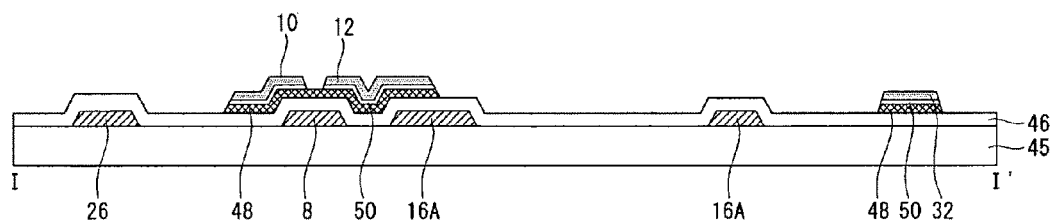
Figure 3B:
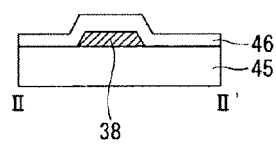

With reference to FIG. 3b, the gate insulating layer 46 is coated on the lower substrate 45 with the first conductive pattern group formed thereon through a deposition method such as PECVD or sputtering. As the material of the gate insulating layer 46, an inorganic insulation material such as silicon oxide (SiOx), silicon nitride (SiNx), or the like, may be used. Subsequently, a semiconductor pattern including the active layer 48 and the ohmic-contact layer 50, and a second conductive pattern group including the data line, the source electrode 10, the drain electrode 12, and the data pad lower electrode 32 are formed on the gate insulating layer 46 by using a second masking process.

In detail, an amorphous silicon layer, an n+ amorphous silicon layer, and a second conductive material are sequentially formed on the lower substrate 45 with the gate insulating layer 46 formed thereon through a deposition method such as PECVD, sputtering, and the like. Here, as the second conductive material, Cr, MoW, MoTi, Cr/Al, Cu, Al(Nd), Mo/Al, Mo/Al(Nd), Cr/Al(Nd), and the like, may be used. Thereafter, a photoresist pattern is formed on the second conductive material through a photolithography process using a second mask. As the second mask, a diffraction (i.e., slit) exposure mask having a diffraction exposure part or a semi-transmissive mask is used at a channel part of the TFT. The second mask makes a photoresist pattern at the channel part be lower than a photoresist pattern at a different second conductive pattern group part. Subsequently, the second conductive material is patterned through a wet etching process using the photoresist pattern to form a second conductive pattern group including the data line 4, the source electrode 10, the drain electrode 12 integrated with the source electrode 10, and the data pad lower electrode 32. And then, the n+ amorphous silicon layer and the amorphous silicon layer are simultaneously patterned through a dry etching process using the same photoresist pattern to form the ohmic-contact layer 50 and the active layer 48. And, the photoresist pattern relatively low at the channel part is removed through an ashing process using oxygen ($O_2$) plasma, and the source/drain metal patterns and the ohmic-contact layer 50 at the channel part are then etched through a dry etching process. Accordingly, the active layer 48 of the channel part is exposed, separating the source electrode 10 and the drain electrode 12. Thereafter, the photoresist patterns remaining on the second conductive pattern group are all removed through a strip process.

Figure 3C:
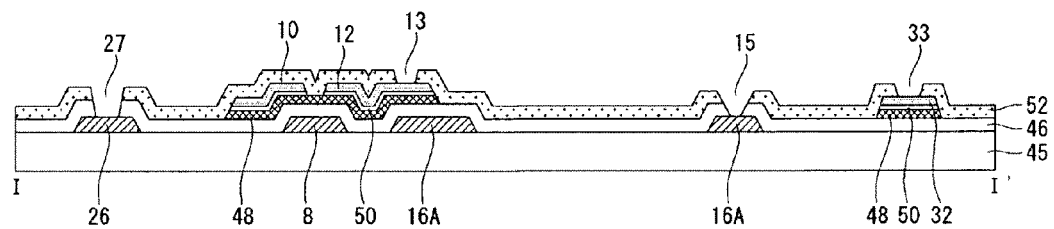
Figure 3C:
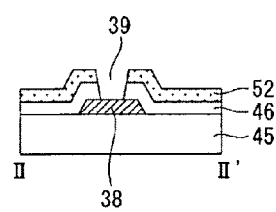

With reference to FIG. 3c, the passivation film 52, including the first to fifth contact holes 13, 15, 27, 33, and 39, is formed on the gate insulating layer 46 with the second conductive pattern group formed thereon by using a third masking process.

In detail, the passivation film 52 is formed on the entire surface of the gate insulating layer 46 with the second conductive pattern group formed thereon through a deposition method such as PECVD or the like. As a material of the passivation film 52, an in organic insulation material similar to the gate insulating layer 46, an acrylic organic compound having a small dielectric constant, or an organic insulation material such as benzocyclobetene (BCB), perfluorocyclobutane (PFCB), and the like, may be used. Subsequently, the passivation film 52 is patterned through a photolithography process and an etching process using a third mask to form the first to fifth contact holes 13, 21, 27, 33, and 39. The first contact hole 13, penetrating through the passivation film 52, exposes the drain electrode 12, and the second contact hole 15, penetrating through the passivation film 52 and the gate insulating layer 46, exposes the internal common line 16A. The third contact hole 27, penetrating through the passivation film 52 and the gate insulating layer 46, exposes the gate pad lower electrode 26, the fourth contact hole 33, penetrating through the passivation film 52, exposes the data pad lower electrode 32, and the fifth contact hole 39, penetrating through the passivation film 52 and the gate insulating layer 46, exposes the common pad lower electrode 38.

Figure 3D:
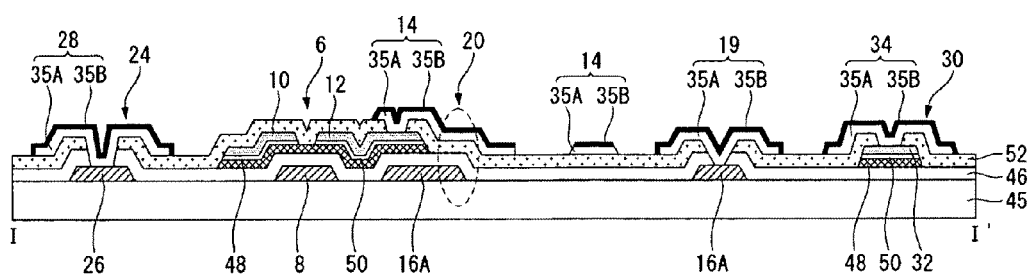
Figure 3D:
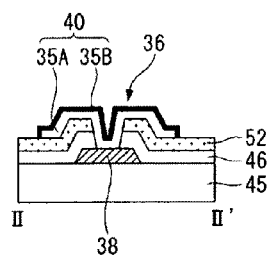

With reference to FIG. 3d, a third conductive pattern group, including the pixel electrode 14, the common electrode 19, the storage upper electrode 22, the gate pad upper electrode 28, the data pad upper electrode 34, and the common pad upper electrode 40 each formed as a dual-layer, is formed by using a fourth masking process.

Figure 4A:
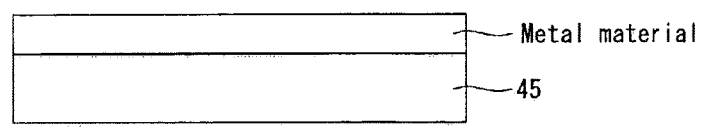
FIGS. 4a to 4c illustrate the process of FIG. 3d in detail.
Figure 4B:
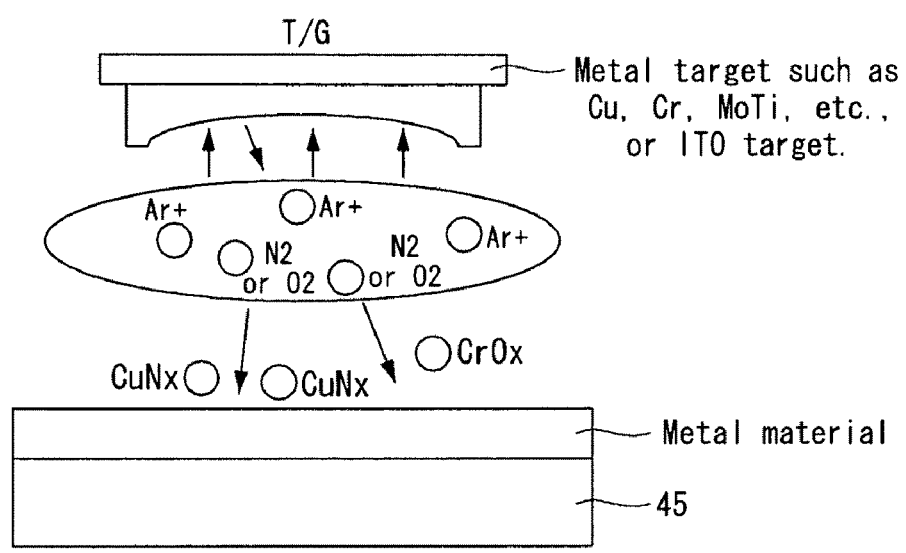
Figure 4C:

In detail, as shown in FIG. 4a, a metal material is coated on the lower substrate 45 with the passivation film 52 including the contact holes 13, 15, 27, 33, and 39 formed thereon, through a deposition method such as sputtering or the like. As the metal material, Cr, MoW, MoTi, Cr/Al, Cu, Al(Nd), Mo/Al, Mo/Al(Nd), Cr/Al(Nd), and the like, may be used. Subsequently, a reactive sputtering process is performed by using a metal target such as Cu, Cr, MoTi, and the like, that reacts with nitrogen ($N_2$) plasma or oxygen ($O_2$) plasma, to form a low reflection material on the lower substrate 45 with the metal material formed thereon. In this case, as the low reflection material, a nitride-based material such as CuNx, MoTiNx, and the like, is used.

Meanwhile, in the reactive sputtering process, a transparent conductive target such as ITO, IZO, TO, and the like, may be used instead of the metal target. In this case, an oxide-based material such as ITO, IZO, TO, CrOx, and the like, is used as the low reflection material.

A deposition thickness of the low reflection material is preferably 30 Å to 1000 Å. If the thickness of the low reflection material is lower than 30 Å, the function of reducing the surface reflexibility is degraded, while if the thickness of the low reflection material exceeds 1000 Å, a deposition quality is degraded and the luminance is reduced.

Subsequently, the metal material and the low reflection material are simultaneously patterned through a photolithography process and an etching process using a fourth mask to form the third conductive pattern group including the pixel electrode 14, the common electrode 19, the gate pad upper electrode 28, the data pad upper electrode 34, and the common pad upper electrode 40 each including dual-layer (metal film 35A and low reflection film 35B). The pixel electrode 14 is electrically connected with the drain electrode 12 via the first contact hole 13. The common electrode 19 is electrically connected with the internal common line 16A via the second contact hole 15. The gate pad upper electrode 28 is electrically connected with the gate pad lower electrode 26 via the third contact hole 27. The data pad upper electrode 34 is electrically connected with the data pad lower electrode 32 via the fourth contact hole 33. The common pad upper electrode 40 is electrically connected with the common pad lower electrode 38 via the fifth contact hole 39.

Figure 5A:
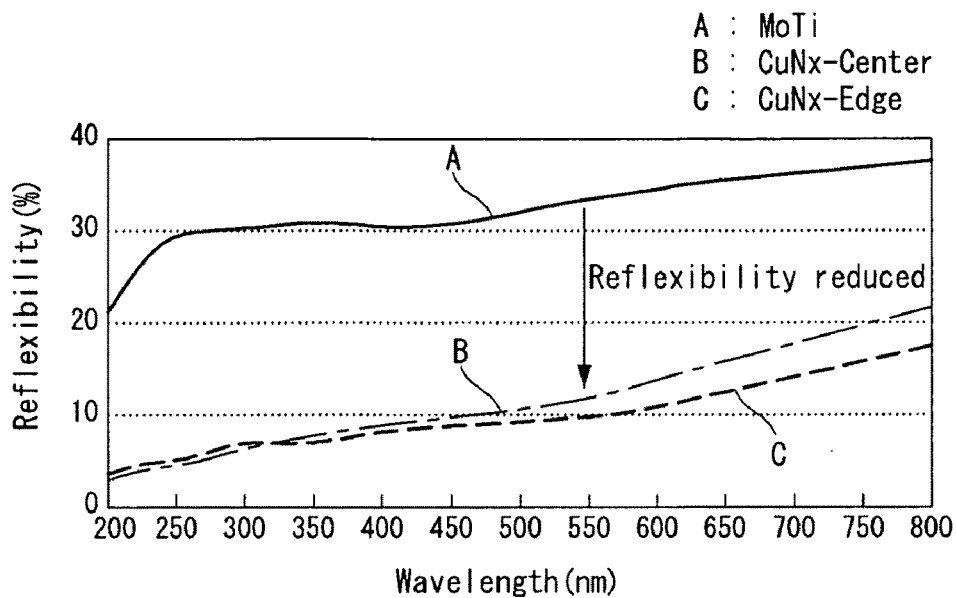
FIG. 5a is a graph showing simulation results obtained by comparing a reflexibility in case of forming a third conductive pattern group as a dual-layer including a low reflection film made of a nitride material according to an exemplary embodiment of the present invention to reflexibility in case of forming a third conductive pattern group as a single metal film according to the related art.

FIG. 5a is a graph showing simulation results obtained by comparing a reflexibility in case of forming the third conductive pattern group as a dual-layer including a low reflection film made of a nitride material according to an exemplary embodiment of the present invention to reflexibility in case of forming a third conductive pattern group as a single metal film according to the related art. In the graph shown in FIG. 5, a vertical axis indicates reflexibility (%) and a horizontal axis indicates wavelength (nm). In the graph, a line 'A' represents reflexibility when the third conductive pattern group is formed as an MoTi single film, a line 'B' represents reflexibility at a middle portion of the third conductive pattern group formed as a dual-layer of MoTi and CuNx, and a line 'C' represents reflexibility at an edge portion of the third conductive pattern group formed as a dual-layer of MoTi and CuNx.

As shown in FIG. 5a, it is noted that the surface reflexibilities 'B' and 'C' according to the exemplary embodiment of the present invention are much smaller than the related art reflexibility 'A'.

Figure 5B:
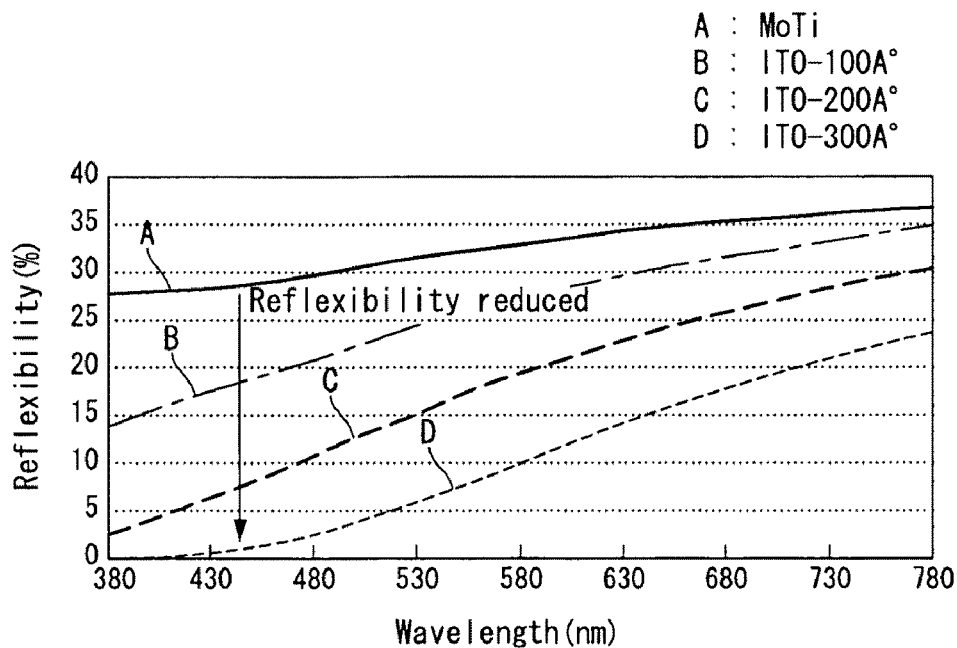
FIG. 5b is a graph showing simulation results obtained by comparing a reflexibility in case of forming a third conductive pattern group as a dual-layer including a low reflection film made of an oxide material according to an exemplary embodiment of the present invention to reflexibility in case of forming a third conductive pattern group as a single metal film according to the related art.

FIG. 5b is a graph showing simulation results obtained by comparing a reflexibility in case of forming the third conductive pattern group as a dual-layer including a low reflection film made of an oxide material according to an exemplary embodiment of the present invention to reflexibility in case of forming the third conductive pattern group as a single metal film according to the related art. In the graph shown in FIG. 5b, a vertical axis indicates reflexibility (%), and a horizontal axis indicates wavelength (nm). In the graph, a line 'A' represents reflexibility in case of forming the third conductive pattern group as a MoTi single film, a line 'B' represents reflexibility in case of forming the third conductive pattern group as a dual-layer of MoTi and ITO (100 Å), a line 'C' represents reflexibility in case of forming the third conductive pattern group as a dual-layer of MoTi and ITO (200 Å), and a line 'D' represents reflexibility in case of forming the third conductive pattern group as a dual-layer of MoTi and ITO (300 Å).

As shown in FIG. 5b, it is noted that the surface reflexibilities 'B' to 'D' according to the exemplary embodiment of the present invention are much smaller than the related art reflexibility 'A'. Because the low reflection film serves to absorb external light, the effect of reducing the surface reflexibility is increased as the thickness of the low reflection film increases within a certain range (30 Å to 1000 Å).

As described above, according to the LCD and its fabrication method according to the first exemplary embodiment of the present invention, the third conductive pattern group of the pixel electrode and the like is formed as the dual-layer including the metal film and the low reflection film, so the reflexibility at the electrode surface can be reduced over external light while increasing the contrast ratio of a display image, thereby significantly reducing generation of spots due to external light. The LCD and its fabrication method according to the first exemplary embodiment of the present invention can be applicable as it is to any configuration, such as, for example, a fringe field switching (FFS) mode LCD, in which the pixel electrodes and common electrodes form horizontal fields and have a finger structure.

<Second Embodiment>

A second exemplary embodiment of the present invention will now be described with reference to FIGS. 6 to 9. In the second exemplary embodiment, pixel part and pad part electrodes are formed as a single transparent conductive film with an embossed surface through haze processing.

Figure 6:
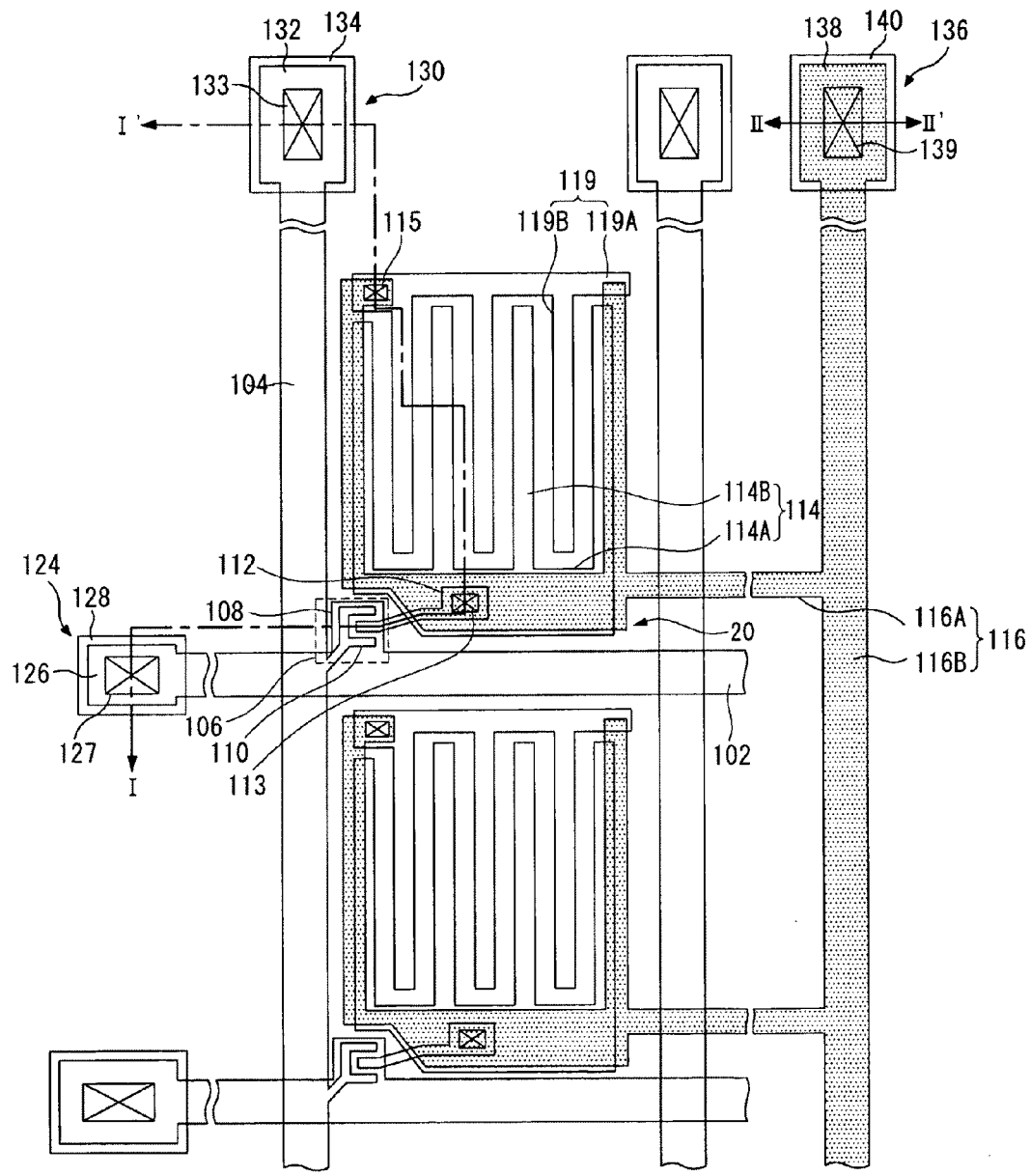
FIG. 6 is a plan view of a TFT array substrate according to a second exemplary embodiment of the present invention.
Figure 7:
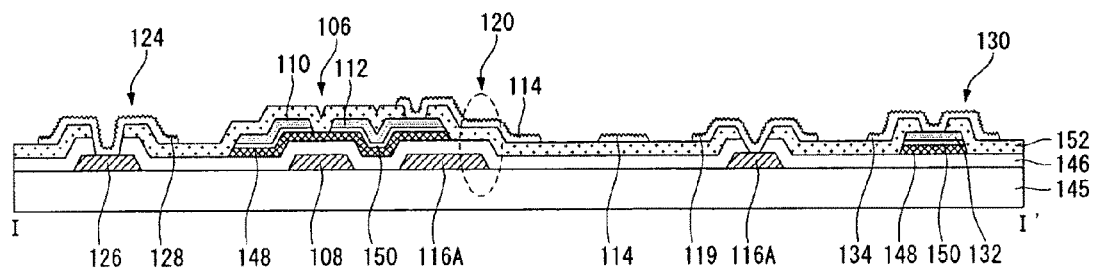
FIG. 7 is a sectional view of the TFT array substrate taken along lines I-I' and II-II' in FIG. 6.
Figure 7:
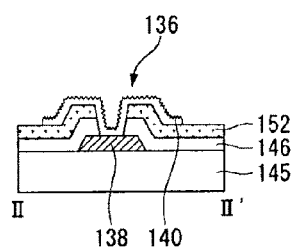

FIG. 6 is a plan view of a TFT array substrate using four masking processes according to a second exemplary embodiment of the present invention, and FIG. 7 is a sectional view of the TFT array substrate taken along lines and II-IP in FIG. 6.

The TFT array substrate as illustrated in FIGS. 6 and 7 includes a gate line 102 and a data line 104 formed to cross with a gate insulating layer 146 interposed therebetween on a lower substrate 145, a TFT 106 formed at each crossing, a pixel electrode 114 and a common electrode 119 formed to form a horizontal field at a pixel area provided with the crossing structure, and a common line 116 connected with the common electrode 119. Further, the TFT array substrate includes a storage capacitor 120 formed at an overlap portion of the common line 116 and the pixel electrode 114, a gate pad 124 connected with the gate line 102, a data pad 133 connected with the data line 104, and a common pad 136 connected with the common line 116.

The gate line 102 supplying a gate signal and the data line 104 supplying a data signal are formed with a crossing structure with the gate insulating layer interposed therebetween, defining the pixel area. Here, the gate line 102 is formed as a first conductive pattern (i.e., gate metal pattern), and the data line 104 is formed as a second conductive pattern (i.e., source/drain metal patterns).

The common line 116 and the common electrode 119 supply a reference voltage for driving liquid crystal. The common line 116 includes an internal common line 116A formed to partially overlap with the pixel electrode 114 at a display area and an external common line 116B commonly connecting internal common lines 116A at a non-display area. The common line 116 is formed as a first conductive pattern.

The common electrode 119 includes a horizontal part 119A formed to be parallel to the gate line 102 and connected with the internal common line 116A via a second contact hole 115 penetrating through the gate insulating layer 146 and a passivation film 152, and a finger part 119B extending from the horizontal part 119A to the pixel area. The common electrode 119 is formed as a third conductive pattern, a single transparent conductive pattern, having an embossed surface.

The TFT 106 is switched in response to a gate signal of the gate line 102 to charge a pixel signal of the data line 104 to the pixel electrode 114. To this end, the TFT includes a gate electrode 108 connected with the gate line 102, a source electrode 110 connected with the data line 104, and a drain electrode 112 connected with the pixel electrode. Further, the TFT 106 includes an active layer 148 overlapping with the gate electrode 188 and the internal common line 116A with the gate insulating layer 146 interposed therebetween and forming a channel between the source electrode 110 and the drain electrode 112, and an ohmic-contact layer 150 formed on the active layer 148, excluding the channel, for an ohmic-contact with the source electrode 110 and the drain electrode 112. The active layer 148 and the ohmic-contact layer 150 are formed to overlap with the data line 104 formed as the second conductive pattern and the data pad lower electrode 132 together with the source electrode 110 and the drain electrode 112.

The pixel electrode 114, facing the common electrode 119 at the pixel area, forms a horizontal field. The pixel electrode 114 is connected with the drain electrode 112 of the TFT 6 via a first contact hole 113 penetrating through the passivation film 152 and formed at the pixel area. In particular, the pixel electrode 114 includes a horizontal part 114A connected with the drain electrode 112 and formed to be parallel to an adjacent gate line 102, and a finger part 114B, which has a finger shape, extending from the horizontal part 114A to the pixel area and formed to be parallel to the finger part of the common electrode 119. The pixel electrode 114 is formed as a third conductive pattern, a single transparent conductive pattern, having an embossed surface.

The horizontal part 114A and the outermost finger part 114B of the pixel electrode 114 overlap partially with the internal common line 116A with the gate insulating layer 146 and the passivation film 152 interposed therebetween, forming a storage capacitor 120. The storage capacitor 120 stably maintains a pixel signal of a current which has been charged in the pixel electrode 114 until when a pixel signal of a next frame is charged.

The gate line 102 is connected with a gate driver (not shown) via the gate pad 124. The gate pad 124 includes a gate pad lower electrode 126 extending from the gate line 102 and a gate pad upper electrode 128 connected with the gate pad lower electrode 126 via a third contact hole 127 penetrating through the gate insulating layer 146 and the passivation film 152. The gate pad lower electrode 126 is formed as the first conductive pattern, and the gate pad upper electrode 128 is formed as the third conductive pattern, a single transparent conductive pattern, having an embossed surface.

The data line 104 is connected with a data driver (not shown) via a data pad 130. The data pad includes a data pad lower electrode 132 extending from the data line 104 and a data pad upper electrode 134 connected with the data pad lower electrode 132 via a fourth contact hole 133 penetrating through the passivation film 152. The data pad lower electrode 132 is formed as the second conductive pattern, and the data pad upper electrode 134 is formed as the third conductive pattern of a dual-layer including the metal film 135A and the low reflection film 135B.

The common line 116 is connected with an external reference voltage source (not shown) via the common pad 136. The common pad 136 includes a common pad lower electrode 138 extending from the eternal common line 116B and a common pad upper electrode 140 connected with the common pad lower electrode 138 via a fifth contact hole 139 penetrating through the gate insulating layer 146 and the passivation film 152. The common pad lower electrode 138 is formed as the first conductive pattern, and the common pad upper electrode 140 is formed as the third conductive pattern, a single transparent conductive pattern, having an embossed surface.

The third conductive pattern including the pixel electrode 114, the common electrode 119, the gate pad upper electrode 128, the data pad upper electrode 134, and the common pad upper electrode 140 is formed as the single transparent conductive film having the embossed surface. The third conductive pattern scatters external light made incident thereto from its embossed surface to considerably reduce the amount of reflection of the external light that may cause a constructive interference or destructive interference over light made incident from a backlight of the LCD, thus reducing the surface reflexibility with respect to the external light. In addition, the third conductive pattern having the embossed surface restrains an increase in the transmissivity to lead to an increase in the contrast ratio, compared with the case where the surface is smooth.

The method of fabricating the TFT array substrate with such configuration is substantially the same as that of the fabrication method described with reference to FIGS. 3a to 4c, except for the formation of the third conductive pattern group. Thus, only the method of forming the third conductive pattern group will now be described.

When first to third masking processes are performed, the passivation film 152 including the contact holes 113, 115, 127, 133, and 139 are formed along with the first and second conductive pattern groups on the substrate 145. The third conductive pattern group made of a transparent conductive material, including the pixel electrode 114, the common electrode 199, the storage upper electrode 122, the gate pad upper electrode 128, the data pad upper electrode 134, and the common pad upper electrode 140, each having the embossed surface, is formed on the passivation film 152 by using a fourth masking process.

Figure 8A:
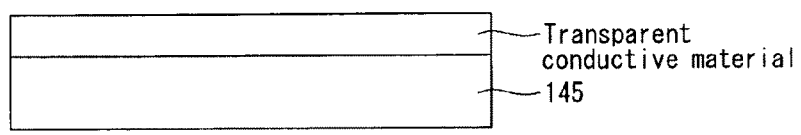
FIGS. 8a to 8c illustrate haze processing.
Figure 8B:
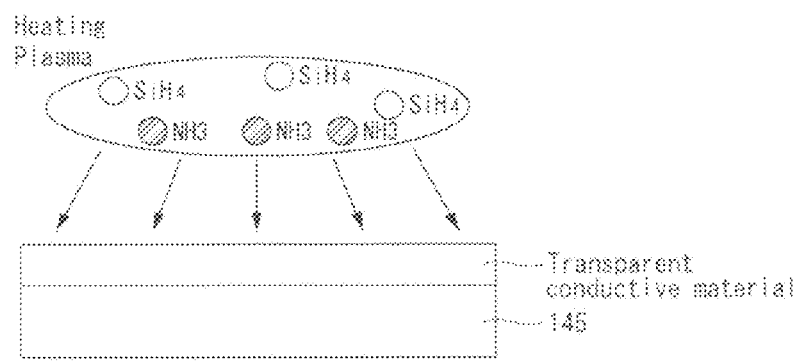
Figure 8C:
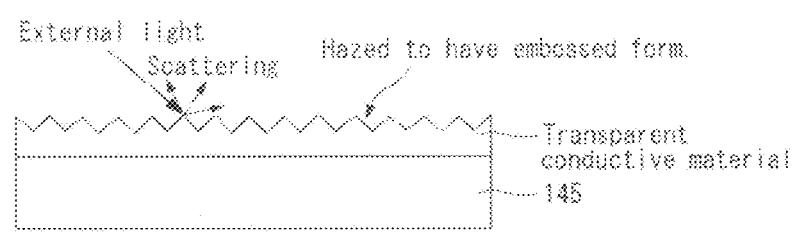
Figure 9:
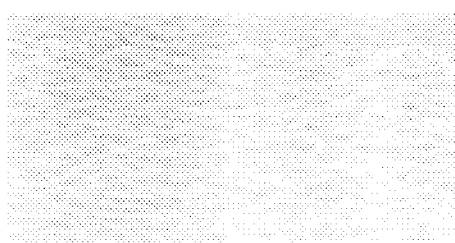
FIG. 9 is photographs showing magnified surfaces of a transparent conductive material before and after haze processing.
Figure 9:
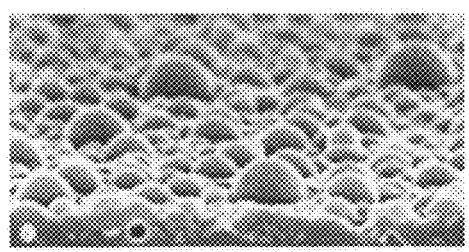

In detail, as shown in FIG. 8a, a transparent conductive material is coated on the lower substrate 145 with the passivation film 152 formed thereon through a deposition method such as sputtering or the like. As the transparent conductive material, ITO, IZO, and the like, may be used. Subsequently, as shown in FIG. 8b, SiH4 or NH3 gas is injected into a processing chamber in which a certain temperature and pressure are maintained, to plasma-process the transparent conductive material formed on the lower substrate 145. Then, the surface of the transparent conductive material is haze-processed in an embossed form through the plasma processing as shown in FIG. 8c. The certain pressure may be 500 mmTorr or lower, and the certain temperature may range from 200° C. to 700° C. As to the haze processing, an oxygen component of the transparent conductive material and a hydrogen component of the injected gas react with each other under a plasma atmosphere, generating water, and reduction occurs in an indium (In) component constituting the transparent conductive material due to the influence of the chemical reaction. Roughness of the surface of the transparent conductive material increases due to the reduction of the indium component, resulting in the distinct embossed form as shown in FIG. 9.

When the haze processing is completed, the transparent conductive material is patterned through a photolithography process and an etching process using a fourth mask to form the third conductive pattern group including the pixel electrode 114, the common electrode 199, the gate pad upper electrode 128, the data pad upper electrode 134, and the common pad upper electrode 140 each having the embossed surface. The pixel electrode 114 is electrically connected with the drain electrode 112 via the first contact hole 113.

The common electrode 119 is electrically connected with the internal common line 116A via the second contact hole 115. The gate pad upper electrode 128 is electrically connected with the gate pad lower electrode 126 via the third contact hole 127. The data pad upper electrode 134 is electrically connected with the data pad lower electrode 132 via the fourth contact hole 133. The common pad upper electrode 140 is electrically connected with the common pad lower electrode 138 via the fifth contact hole 139.

As described above, according to the LCD and its fabrication method according to the second exemplary embodiment of the present invention, the third conductive pattern group such as the pixel electrode and the like is formed as the single transparent conductive film having the embossed surface, so the contrast ratio of a display image can be increased and the reflexibility at the electrode surface with respect to external light can be reduced, thus considerably reducing generation of spots by external light. The second exemplary embodiment of the present invention has a wide applicable coverage compared with the first exemplary embodiment, and is advantageous in terms of time required for processing and a material cost. Also, according to the LCD and its fabrication method according to the second exemplary embodiment of the present invention, the electrode part is formed by using only the haze-processed transparent conductive film, the LCD and its fabrication method according to the second exemplary embodiment can be sufficiently applicable to a vertical field mode, to which the LCD and its fabrication method according to the first exemplary embodiment can be hardly applicable, due to degradation of luminance (because of the presence of the metal film) as well as to the horizontal field mode. In other words, the technique proposed through the second exemplary embodiment of the present invention can be applicable as it is to any mode, for example, an IPS mode, an FFS mode, a TN mode, a VA mode, and the like, in which an electrode part is formed by using a transparent conductive film. In addition, according to the LCD and its fabrication method according to the second exemplary embodiment of the present invention, the electrode part is formed as the single transparent conductive film, time required for processing can be shortened and the material cost can be reduced compared with the first exemplary embodiment in which the electrode part is formed as a dual-layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A liquid crystal display (LCD) device comprising:
a gate line formed as a first conductive pattern;
a common line separated from the gate line and formed as the first conductive pattern;
a data line insulatedly crossing the gate line and the common line to define a pixel area, and formed as a second conductive pattern;
a thin film transistor (TFT) formed at a crossing of the gate line and the data line;
a common electrode formed as a third conductive pattern at the pixel area, and connected with the common line; and
a pixel electrode connected with the TFT and formed as the third conductive pattern to form a horizontal field together with the common electrode in the pixel area,
wherein the third conductive pattern is formed as a dual-layer comprising a metal film and a low reflection film formed on the metal film,
wherein the low reflection film has a thickness of 30 Å to 1000 Å.

2. The device of claim 1, wherein the low reflection film contains a nitride material or an oxide material.

3. The device of claim 2, wherein the low reflection film comprises at least one of CuNx, MoTiNx, ITO, IZO, TO, and CrOx.

4. The device of claim 1, further comprising:
- a gate pad comprising a gate pad lower electrode connected with the gate line and a gate pad upper electrode being in contact with the gate pad lower electrode via a contact hole;
- a data pad comprising a data pad lower electrode connected with the data line and a data pad upper electrode being in contact with the data pad lower electrode via a contact hole; and
- a common pad comprising a common pad lower electrode connected with the common line and a common pad upper electrode being in contact with the common pad lower electrode via a contact hole,
- wherein the gate pad upper electrode, the data pad upper electrode, and the common pad upper electrode are formed as the third conductive pattern.

5. A method for fabricating a liquid crystal display (LCD), the method comprising:
- forming a gate line with a first conductive pattern, a gate electrode of a thin film transistor (TFT) connected with the gate line, and a common line separated from the gate line on a substrate;
- coating a gate insulating layer on the entire surface of the resultant substrate and forming a semiconductor pattern at a certain region on the gate insulating layer;
- forming a data line with a second conductive pattern on the semiconductor pattern such that it crosses the gate line and the common line to define a pixel area, a source electrode of the TFT connected with the data line, and a drain electrode of the TFT facing the source electrode;
- coating a passivation film on the entire surface of the resultant substrate, and patterning the passivation film and the gate insulating layer to expose a portion of the common line and a portion of the drain electrode;
- forming a common electrode with a third conductive pattern connected with the exposed common line; and
- forming a pixel electrode with the third conductive pattern connected with the exposed drain electrode to form a horizontal field at the pixel area, the pixel electrode facing the common electrode,
- wherein the third conductive pattern is formed as a dual-layer comprising a metal film and a low reflection film formed on the metal film,
- wherein the low reflection film has a thickness of 30 Å to 1000 Å.

6. The method of claim 5, wherein the low reflection film contains a nitride material or an oxide material.

7. The method of claim 6, wherein the low reflection film comprises at least one of CuNx, MoTiNx, ITO, IZO, TO, and CrOx.

8. The method of claim 5, further comprising:
- forming a gate pad which has the first conductive pattern and comprises a gate pad lower electrode connected with the gate line and a gate pad upper electrode being in contact with the gate pad lower electrode via a contact hole;
- forming a data pad which has the second conductive pattern and comprises a data pad lower electrode connected with the data line and a data pad upper electrode being in contact with the data pad lower electrode via a contact hole; and
- forming a common pad which has the first conductive pattern and comprises a common pad lower electrode connected with the common line and a common pad upper electrode being in contact with the common pad lower electrode via a contact hole,
- wherein the gate pad upper electrode, the data pad upper electrode, and the common pad upper electrode are formed as the third conductive pattern.

* * * * *